(12) United States Patent
Li et al.

(10) Patent No.: US 12,725,574 B2
(45) Date of Patent: Sep. 1, 2026

(54) DISPLAY PANEL AND DISPLAY DEVICE

(71) Applicant: HKC CORPORATION LIMITED, Shenzhen (CN)

(72) Inventors: Wenxin Li, Shenzhen (CN); Lidan Ye, Shenzhen (CN)

(73) Assignee: HKC CORPORATION, Shenzhen (CN)

( * ) Notice: Subject to any disclaimer, the term of this patent is extended or adjusted under 35 U.S.C. 154(b) by 0 days.

(21) Appl. No.: 19/060,168

(22) Filed: Feb. 21, 2025

(65) Prior Publication Data

US 2025/0299631 A1 Sep. 25, 2025

(30) Foreign Application Priority Data

Mar. 19, 2024 (CN) ......................... 202410314353.2

(51) Int. Cl.
*G09G 3/3233* (2016.01)
*H10D 86/40* (2025.01)
*G09G 3/32* (2016.01)

(52) U.S. Cl.
CPC ......... *G09G 3/3233* (2013.01); *H10D 86/441* (2025.01); *G09G 3/32* (2013.01);
(Continued)

(58) Field of Classification Search
CPC .. G09G 3/3233; G09G 3/3225; G09G 3/3208; G09G 3/3291; G09G 3/32;
(Continued)

(56) References Cited

U.S. PATENT DOCUMENTS 10,262,596 B2 * 4/2019 Sano .................... G09G 3/3258
11,663,961 B2 * 5/2023 Liu .......................... G09G 3/32 345/55
(Continued)

FOREIGN PATENT DOCUMENTS

CN 108399895 A 8/2018
CN 108877664 A 11/2018
(Continued)

OTHER PUBLICATIONS

Chinese Notification to Grant Patent Right for Invention, Chinese Application No. 202410314353.2, mailed Apr. 21, 2024 (7 pages).

*Primary Examiner* — Xuemei Zheng

(57) ABSTRACT

A display panel and a display device are provided. The display panel includes a plurality of driving wirings, a plurality of first sub-pixel units, and a plurality of second sub-pixel units. The plurality of driving wirings are configured to transmit data driving signals. Each of the plurality of first sub-pixel units includes a sub-pixel driving circuit and a first driving light-emitting unit, an input end of the sub-pixel driving circuit is electrically connected to a corresponding one of the plurality of driving wirings, and an output end of the sub-pixel driving circuit is electrically connected to a corresponding first driving light-emitting unit. In at least some of the plurality of first sub-pixel units, each of the plurality of second sub-pixel unit is disposed between adjacent first sub-pixel units. Each of the plurality of second sub-pixel units only includes a second driving light-emitting unit.

18 Claims, 3 Drawing Sheets

(52) U.S. Cl.
CPC ............... *G09G 2300/0452* (2013.01); *G09G 2300/0465* (2013.01); *G09G 2300/0809* (2013.01)

(58) Field of Classification Search
CPC ... G09G 2300/0452; G09G 2300/0465; G09G 2300/0809; H10D 86/441; H10D 86/60
See application file for complete search history.

(56) References Cited

U.S. PATENT DOCUMENTS

| | | | | |
|---|---|---|---|---|
| 2017/0154576 | A1 | 6/2017 | Sun | |
| 2019/0279565 | A1* | 9/2019 | Yang .................... | G09G 3/3266 |
| 2019/0362667 | A1* | 11/2019 | Ma ..................... | G06V 40/1318 |
| 2020/0175911 | A1 | 6/2020 | Ko et al. | |
| 2024/0071321 | A1* | 2/2024 | Lu ........................ | G09G 3/3291 |

FOREIGN PATENT DOCUMENTS

| | | | | | |
|---|---|---|---|---|---|
| CN | 109166529 | A | | 1/2019 | |
| CN | 113223440 | A | | 8/2021 | |
| CN | 113763817 | A | | 12/2021 | |
| CN | 114299867 | A | | 4/2022 | |
| CN | 114495830 | A | | 5/2022 | |
| CN | 115331629 | A | * | 11/2022 | ........... G09G 3/3225 |
| WO | 2016074418 | A1 | | 5/2016 | |
| WO | 2023193489 | A1 | | 10/2023 | |

* cited by examiner

DISPLAY PANEL AND DISPLAY DEVICE

CROSS-REFERENCE TO RELATED APPLICATIONS

The present application claims priority to Chinese Patent Application No. 202410314353.2, entitled "DISPLAY PANEL AND DISPLAY DEVICE", filed Mar. 19, 2024, which is herein incorporated by reference in its entirety.

TECHNICAL FIELD

The present disclosure relates to the field of display technologies, and in particular to a display panel and a display device.

BACKGROUND

Compared with traditional display technologies, an active matrix organic light-emitting diode (AMLED) has the advantages of wider viewing angle, higher refresh rate, smaller size, higher brightness, lower driving voltage, etc. Thus, the AMLED has been increasingly widely used in the field of display technologies, especially in the field of smart phones. The AMLED is used in a display product that has gradually expanded from a small size to a medium and large size.

At present, in an AMOLED display panel, each sub-pixel unit includes a sub-pixel driving circuit and a driving light-emitting unit. The sub-pixel driving circuit needs to be electrically connected through driving wiring of a corresponding driving module, so as to drive the driving light-emitting unit to display an image. However, since each sub-pixel unit includes the sub-pixel driving circuit and needs to be driven through the driving wiring, it is difficult to improve a pixel density of the display panel.

SUMMARY OF THE DISCLOSURE

A first technical solution in the present disclosure is to provide a display panel. The display panel includes a plurality of driving wirings, a plurality of first sub-pixel units, and a plurality of second sub-pixel units.

The plurality of driving wirings are configured to transmit data driving signals.

Each of the plurality of first sub-pixel units includes a sub-pixel driving circuit and a first driving light-emitting unit, an input end of the sub-pixel driving circuit is electrically connected to a corresponding one of the plurality of driving wirings, and an output end of the sub-pixel driving circuit is electrically connected to a corresponding first driving light-emitting unit.

In at least some of the plurality of first sub-pixel units, each of the plurality of second sub-pixel unit is disposed between adjacent first sub-pixel units.

Each of the plurality of second sub-pixel units only includes a second driving light-emitting unit, and the second driving light-emitting unit is coupled to output ends of the sub-pixel driving circuits of at least two adjacent first sub-pixel units, so as to drive a corresponding one of the plurality of second sub-pixel units through the sub-pixel driving circuits of the at least two adjacent first sub-pixel units.

In some embodiments, the first driving light-emitting unit includes a first driving transistor and a first light-emitting element, a gate of the first driving transistor is electrically connected to the output end of the sub-pixel driving circuit, a first end of the first driving transistor is connected to a power signal, and a second end of the first driving transistor is electrically connected to the first light emitting element.

The second driving light-emitting unit includes a second driving transistor and a second light-emitting element, a gate of the second driving transistor is coupled to the output ends of the sub-pixel driving circuits of at least two adjacent first sub-pixel units, a first end of the second driving transistor is connected to the power signal, and a second end of the second driving transistor is electrically connected to the second light-emitting element.

In some embodiments, the display panel further includes a voltage-dividing unit, and the second driving light emitting unit is electrically connected to the output ends of the sub-pixel driving circuits of at least two adjacent first sub-pixel units through the voltage-dividing unit.

The gate of the second driving transistor is electrically connected to the output ends of the sub-pixel driving circuits of at least two adjacent first sub-pixel units through the voltage-dividing unit.

In some embodiments, the plurality of first sub-pixel units includes at least three sub-pixel units with different colors, and the at least three sub-pixel units with different colors are arranged in a pixel matrix according to a preset pattern.

Each of the plurality of driving wirings is disposed on a side of each column of the plurality of first sub-pixel units or a side of each row of the plurality of first sub-pixel units, each of the plurality of driving wirings extends along a column direction of the pixel matrix or a row direction of the pixel matrix, and the plurality of first sub-pixel units in the same row or in the same column are connected to the same driving wiring.

In some embodiments, a row and/or a column of the plurality of second sub-pixel units are disposed between every two adjacent rows and/or every two adjacent columns of the plurality of first sub-pixel units.

In some embodiments, the voltage-dividing unit includes two first voltage-dividing resistors and a voltage-dividing node, ends of the two first voltage-dividing resistors is electrically connected to the voltage-dividing node respectively, the other ends of the two first voltage-dividing resistors serve as a first connection end and a second connection end respectively, and a connection node between the two first voltage-dividing resistors serves as a third connection end.

In the second plurality of sub-pixel units disposed in the same row and/or column as the plurality of first sub-pixel units, the output ends of the sub-pixel driving circuits of two first sub-pixel units adjacent to the corresponding one of the plurality of second sub-pixel units are electrically connected to the first connection end and the second connection end respectively, and the third connection end is electrically connected to a gate of a second transistor.

In some embodiments, the voltage-dividing unit includes two voltage-dividing sub-units, each voltage-dividing sub-unit includes two first voltage-dividing resistors, a second voltage-dividing resistor, and a voltage-dividing node; ends of the two first voltage-dividing resistors and one second voltage-dividing resistor are respectively electrically connected to the voltage-dividing node, and the other ends of the two first voltage-dividing resistors serve as the first connection end and the second connection end, respectively; the other ends of the second voltage-dividing resistors of two groups of voltage-dividing sub-units are electrically connected to each other, and a connection node serves as the third connection end.

In the plurality of second sub-pixel units disposed in different rows and columns from the plurality of first sub-pixel units, the sub-pixel driving circuits of four first sub-pixel units adjacent to the corresponding one of the plurality of second sub-pixel units are respectively electrically connected to the first connection end and the second connection end of the two voltage-dividing sub-units, and the third connection end is electrically connected to a gate of a second transistor.

In some embodiments, a resistance value of each first voltage-dividing resistor is the same as a resistance value of each second voltage-dividing resistor.

In some embodiments, in each row and/or each column of sub-pixel units, a color of one of the plurality of second sub-pixel units is different from colors of two first sub-pixel units adjacent to the one of the plurality of second sub-pixel units, so that the one of the plurality of second sub-pixel units and the two first sub-pixel units adjacent to the one of the plurality of second sub-pixel units form a pixel unit.

In some embodiments, the sub-pixel driving circuit is configured to generate a display data voltage through cooperation of a plurality of thin film transistors, and the display data voltage is configured for driving and compensation, thereby driving the first driving light-emitting unit to display corresponding brightness.

A second technical solution in the present disclosure is to provide a display device. The display device includes the display panel of any one of above embodiments.

BRIEF DESCRIPTION OF THE DRAWINGS

In order to more clearly illustrate the technical solutions in some embodiments of the present disclosure, hereinafter, a brief introduction will be given to the accompanying drawings that are used in the description of some embodiments. Obviously, the accompanying drawings in the description below are merely some embodiments of the present disclosure. For those of ordinary skill in the art, other accompanying drawings may be obtained based on these accompanying drawings without any creative efforts.

DETAILED DESCRIPTION

Figure 1:
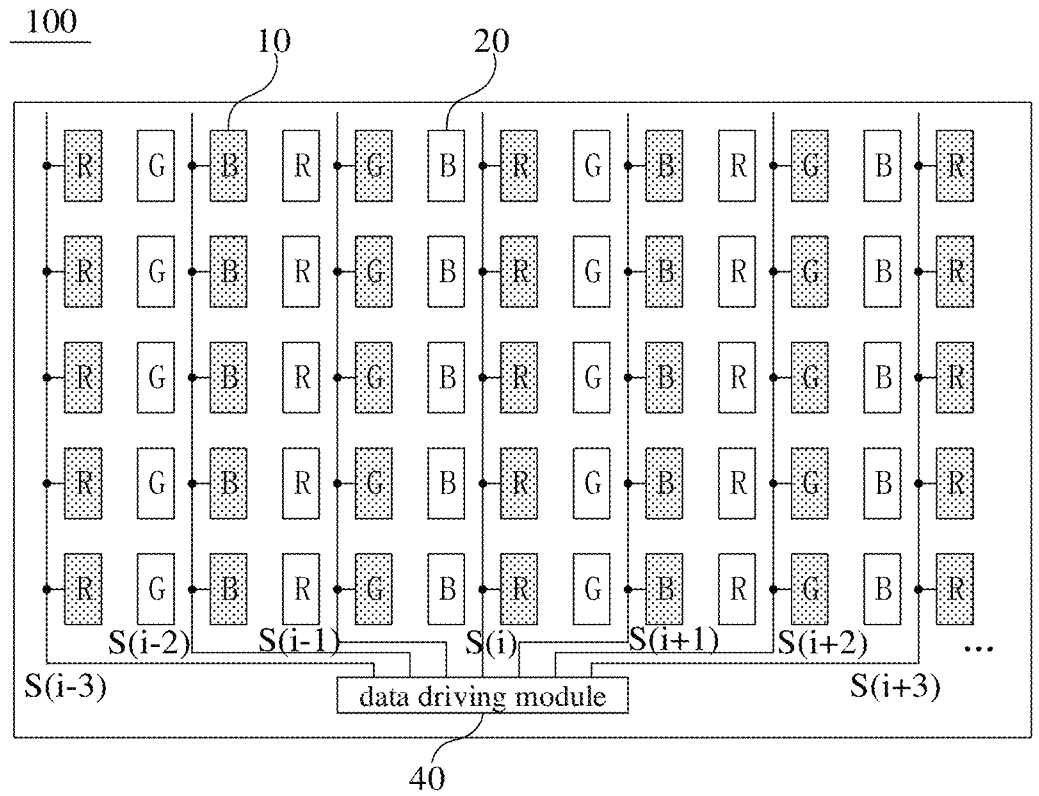
FIG. 1 is a structural schematic view of a display panel in a first embodiment of the present disclosure.

The technical solutions in some embodiments of the present disclosure may be explained in detail by combining the accompanying drawings.

In the following description, specific details such as specific system structures, interfaces, technologies, etc. are proposed for the purpose of illustration rather than limitation, so as to fully understand the present disclosure.

The technical solutions in some embodiments of the present disclosure may be clearly and completely described in conjunction with accompanying drawings in some embodiments of the present disclosure. Obviously, the described embodiments are only a part of the embodiments of the present disclosure, and not all embodiments. Based on the embodiments in the present disclosure, all other embodiments obtained by those of ordinary skill in the art without creative effort are within the scope of the present disclosure.

The terms "first", "second", and "third" in the present disclosure are only configured to describe purposes and cannot be understood as indicating or implying relative importance or implicit indicating the quantity of technical features indicated. Therefore, features limited to "first", "second", and "third" may explicitly or implicitly include at least one of these features. In the description of the present disclosure, "multiple" means at least two, such as two, three, etc., unless otherwise expressly and specifically qualified. All directional indications (such as up, down, left, right, front, rear, or the like) in some embodiments of the present disclosure are only configured to explain a relative position relationship between components in a specific posture (as shown in the accompanying drawings), a motion situation between the components in the specific posture (as shown in the accompanying drawings), or the like. If the specific posture is changed, the directional indication is also changed accordingly. In addition, the terms "including", "comprising", and "having", as well as any variations of the terms "including", "comprising", and "having", are intended to cover non-exclusive inclusions. For example, a process, method, system, product, or device that includes a series of operations or units is not limited to the listed operations or units, but optionally includes operations or units that are not listed, or optionally includes other operations or units that are inherent to these processes, methods, products, or devices.

The reference to "embodiment" in the present disclosure means that, specific features, structures, or characteristics described in conjunction with some embodiments may be included in at least one embodiment of the present disclosure. The phrase appearing in various positions in the specification does not necessarily refer to the same embodiment, nor is it an independent or alternative embodiment that is mutually exclusive with other embodiments. Those of ordinary skill in the art explicitly and implicitly understand that the embodiments described in the present disclosure may be combined with other embodiments.

The present disclosure may be explained in detail by combining the accompanying drawings and some embodiments.

The present disclosure provides a display panel and a display device, aiming to solve a technical problem in the related art that the pixel density of the display panel is difficult to improve.

Figure 2:
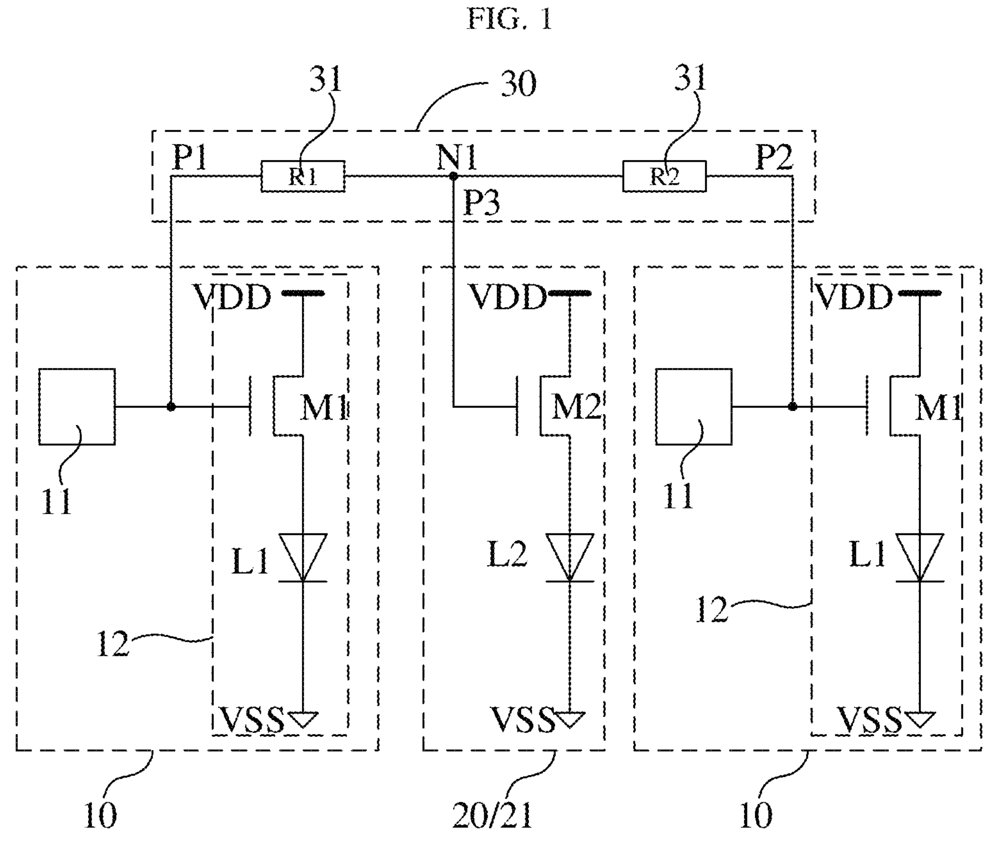
FIG. 2 is a structural schematic view illustrating a circuit principle of a first sub-pixel unit and a second sub-pixel unit in the first embodiment of the present disclosure.

As illustrated in FIG. 1 and FIG. 2, FIG. 1 is a structural schematic view of a display panel in a first embodiment of the present disclosure, and FIG. 2 is a structural schematic view illustrating a circuit principle of a first sub-pixel unit and a second sub-pixel unit in the first embodiment of the present disclosure. In the present embodiment, a display panel 100 is provided. The display panel 100 includes a plurality of driving wirings S(i), a plurality of first sub-pixel units 10, and a plurality of second sub-pixel units 20. The driving wirings S(i) are configured to transmit data driving signals, and each first sub-pixel unit 10 is coupled with a corresponding driving wiring S(i), so as to transmit the data driving signals to each first sub-pixel unit 10 through the corresponding driving wiring S(i), so that each first sub-pixel unit 10 displays the corresponding brightness. In at least some of the first sub-pixel units 10, a second sub-pixel unit 20 is disposed between two adjacent first sub-pixel units 10. The second sub-pixel unit 20 is coupled to at least two adjacent first sub-pixel units 10, thereby driving the second sub-pixel unit 20 to emit light through the first sub-pixel units 10 adjacent to the second sub-pixel unit 20. This arrangement makes it unnecessary for the second sub-pixel unit 20 to be coupled with the driving wiring S(i), which may effectively reduce the number of the driving wirings S(i). In the driving wiring S(i), i represents a serial number of the driving wiring.

As shown in FIG. 2, each first sub-pixel unit 10 includes a sub-pixel driving circuit 11 and a first driving light-emitting unit 12. The sub-pixel driving circuit 11 includes an input end and an output end, the input end is electrically connected to the driving trace S(i), and the output end is electrically connected to the first driving light-emitting unit 12. In a specific application, the sub-pixel driving circuit 11 generates a display data voltage configured for driving and compensation through cooperation of a plurality of thin film transistors (TFTs), thereby driving the first driving light-emitting unit 12 to display corresponding brightness.

In some embodiments, the display panel 100 may further include scan lines (not shown in figures) for transmitting scan control signals. The sub-pixel driving circuit 11 may further include a control end (not shown in figures), the control end is electrically connected to a corresponding scan line. Thus, in response to the scan line transmitting the scan control signals to the control end, the sub-pixel driving circuit 11 is turned on, and the driving wiring S(i) transmits the data driving signals to the input end of the sub-pixel driving circuit 11. The sub-pixel driving circuit 11 generates the display data voltage configured for driving and compensation, and outputs the display data voltage to the output end, so that the first driving light-emitting unit 12 displays light with corresponding brightness under drive of the display data voltage.

The first driving light-emitting unit 12 includes a current-driven light-emitting element configured for emitting light, such as an organic light-emitting diode (OLED), a light-emitting diode (LED), a mini light-emitting diode (Mini-LED), a micro light-emitting diode (Micro-LED) or other light-emitting devices.

In at least some of the first sub-pixel units 10, the second sub-pixel unit 20 is disposed between adjacent first sub-pixel units 10, and the second sub-pixel unit 20 only includes a second driving light-emitting unit 21. The second driving light-emitting unit 21 is coupled to the output ends of the sub-pixel driving circuits 11 of at least two adjacent first sub-pixel units 10, so as to drive the second sub-pixel unit 20 through the sub-pixel driving circuits 11 of the at least two adjacent first sub-pixel units 10.

On the basis of original first sub-pixel units 10, in some embodiments of the present disclosure, the second sub-pixel unit 20 is added and disposed between at least partially adjacent first sub-pixel units 10, and the newly added second sub-pixel unit 20 itself only includes the second driving light-emitting unit 21, and does not include the sub-pixel driving circuit 11. The second sub-pixel unit 20 is driven to emit light through the sub-pixel driving circuits 11 of at least two adjacent first sub-pixel units 10, which effectively reduces the number of the sub-pixel driving circuits 11 on the display panel 100 and the number of driving traces S(i) on the display panel 100, thereby significantly improving the pixel density of the display panel 100. The number of the sub-pixel driving circuits 11 is reduced, no additional cost is added, and production costs of the display panel 100 is saved. Furthermore, the newly added second sub-pixel unit 20 is driven by the sub-pixel driving circuits 11 of the at least two adjacent first sub-pixel units 10, so that the brightness of the second sub-pixel unit 20 transitions between the brightness of the first sub-pixel units 10 adjacent to the second sub-pixel unit 20. That is, a transition sub-pixel is inserted between adjacent first sub-pixels, which may improve fineness of a displayed image and improve display effect.

In some embodiments, the plurality of first sub-pixel units 10 include at least three sub-pixel units with different colors, and the at least three sub-pixel units with different colors are arranged in a pixel matrix according to a preset pattern. In the present embodiment, as illustrated in FIG. 1, the plurality of first sub-pixel units 10 include sub-pixel units with three different colors, namely red sub-pixel units R, green sub-pixel units G, and blue sub-pixel units B. The sub-pixel units with three colors are disposed in the pixel matrix according to the preset pattern. In the present embodiment, the sub-pixel units being alternately arranged in an order of "R-B-G" along a row direction X, and the sub-pixel units in the same column direction Y having the same color, are taken as an example for explanation. In some embodiments, the sub-pixel units are alternately arranged in the order of "R-B-G" along the column direction Y, which may be set according to display requirements and may not be limited.

The driving wiring S(i) is disposed on a side of each column of first sub-pixel units 10 or a side of each row of first sub-pixel units 10, and extends along the column direction Y or the row direction X of the pixel matrix. The first sub-pixel units 10 of the same row or the same column are connected to the same driving wiring S(i), so that the pixel matrix may be scanned and displayed row by row or column by column. In the present embodiment, the driving wiring S(i) is disposed on one side of each column of the first sub-pixel units 10 and extends along the column direction Y of the pixel matrix, and the first sub-pixel units 10 in the same column are connected to the same driving wiring S(i), so that the pixel matrix may be scanned and displayed row by row. In some embodiments, the input end of the sub-pixel driving circuit 11 of each of the first sub-pixel unit 10 in the same column is electrically connected to the same driving wiring S(i), so as to receive the data driving signals.

In the present embodiment, in the pixel matrix, a column of second sub-pixel units 20 is disposed between each two adjacent columns of first sub-pixel units 10. In each row of first sub-pixel units 10, the second sub-pixel unit 20 is added and disposed between each two adjacent first sub-pixel units 10. That is, in each row of sub-pixel units, the first sub-pixel units 10 and the second sub-pixel units 20 are disposed alternately in sequence, so as to improve the pixel density of the display panel 100. In each row of sub-pixel units, a color of the second sub-pixel unit 20 is different from a color of the first sub-pixel units 10 that is left adjacent to second sub-pixel unit 20 and a color of the first sub-pixel units 10 that is right adjacent to second sub-pixel unit 20. Thus, each second sub-pixel unit 20, the first sub-pixel units 10 that is left adjacent to second sub-pixel unit 20, and the first sub-pixel units 10 that is right adjacent to second sub-pixel unit 20 form a pixel unit, thereby improving the display effect, avoiding the problem of image display distortion caused by unreasonable arrangement of pixel units. In the present embodiment, the sub-pixels with the same color that are respectively on the left side and the right side of each second sub-pixel unit 20 and closest to each second sub-pixel unit 20 are all first sub-pixel units 10. The driving methods of the first sub-pixel units 10 and the second sub-pixel units 20 are described in detail below.

As illustrated in FIG. 2, each first sub-pixel unit 10 includes the sub-pixel driving circuit 11 and the first driving light-emitting unit 12. The sub-pixel driving circuit 11 is the sub-pixel driving circuit 11 described above. The first driving light-emitting unit 12 includes a first driving transistor M1 and a first light-emitting element L1. A gate of the first driving transistor M1 is electrically connected to the output end of the sub-pixel driving circuit 11 of the first sub-pixel unit 10. A first end of the first driving transistor M1 is connected to a power supply signal VDD, and a second end of the first driving transistor M1 is electrically connected to the first light-emitting element L1. The first driving transistor M1 may be a metal-oxide semiconductor field-effect transistor (MOS transistor) or other types of transistors, which may be set according to actual circuit design needs and may not be limited. The first light-emitting element L1 is the current-driven light-emitting device as described above, the second end of the first driving transistor M1 is electrically connected to an anode of the first light-emitting element L1, and a cathode of the first light-emitting element L1 is connected to a common voltage signal VSS.

In some embodiments, the control end of the sub-pixel driving circuit 11 is turned on after receiving the scan driving signals. The input end of the sub-pixel driving circuit 11 receives the data driving signals, so as to generate the display data voltage configured for driving and compensation and transmit the display data voltage to the output end, thereby providing the display data voltage to the gate of the first driving transistor M1. The gate of the first driving transistor M1 is turned on after receiving the display data voltage, and controls a current flowing through itself according to a value of the display data voltage of the gate, thereby controlling a current flowing through the first light-emitting element L1, so that the first light-emitting element L1 displays the brightness corresponding to the data driving voltage.

The second sub-pixel unit 20 only includes the second driving light-emitting unit 21. The second driving light-emitting unit 21 includes a second driving transistor M2 and a second light-emitting element L2. A gate of the second driving transistor M2 is coupled to the output ends of the sub-pixel driving circuits 11 of two first sub-pixel units 10 adjacent to the second sub-pixel unit 20. The two first sub-pixel units 10 adjacent to the second sub-pixel unit 20 may be two first sub-pixel units 10 in the same row, one of the two the first sub-pixel units 10 is on the left side of the second sub-pixel unit 20 and adjacent to the second sub-pixel unit 20, and the other of the two first sub-pixel units 10 is on the right side of the second sub-pixel unit 20 and adjacent to the second sub-pixel unit 20. A first end of the second driving transistor M2 is connected to a power signal VDD, and the second end of the second driving transistor M2 is electrically connected to the second light-emitting element L2. The second driving transistor M2 may be the same model as the first driving transistor M1, so that driving the second sub-pixel unit 20 is more convenient to be designed. The second light-emitting element L2 is also the current-driven light-emitting device as described above. The second end of the second driving transistor M2 is electrically connected to an anode of the second light-emitting element L2, and a cathode of the second light-emitting element L2 is connected to the common voltage signal VSS.

In some embodiments, the gate of the second driving transistor M2 is coupled to the output ends of the sub-pixel driving circuits 11 of the two adjacent first sub-pixel units 10, so that the display data voltage output by the sub-pixel driving circuits 11 of the two adjacent first sub-pixel units 10 is processed again by a circuit, so as to generate the display data signals required by the second sub-pixel unit 20. The second driving transistor M2 is turned on after receiving the display data signals, and controls the current flowing through itself according to the value of the display data voltage on the gate, so as to control the current flowing through the second light-emitting element L2, so that the second light-emitting element L2 displays the brightness corresponding to the display data voltage.

In some embodiments, the second driving light emitting unit 21 is electrically connected to the output ends of the sub-pixel driving circuits 11 of the first sub-pixel units 10 that are respectively left and right adjacent to the second sub-pixel unit 20 through a voltage-dividing unit 30. The gate of the second driving transistor M2 is electrically connected to the output ends of the sub-pixel driving circuits 11 of the first sub-pixel units 10 that are respectively left and right adjacent to the second sub-pixel unit 20 through a voltage-dividing unit 30, so as to drive the second sub-pixel unit 20.

In some embodiments, values of two display data signals output from the output ends of the sub-pixel driving circuits 11 of the first sub-pixel units 10 that are respectively left and right adjacent to the second sub-pixel unit 20 are defined as V1 and V2 respectively. After performing the voltage diving processing by the voltage-dividing unit 30, a value of a processed display data signal output from an output end of the voltage-dividing unit 30 is ($a \cdot V1 + b \cdot V2$), wherein a and b are two voltage-dividing parameters of the voltage-dividing unit 30 respectively, $0 \le a \le 1$, and $0 \le b \le 1$. In some embodiments, $a+b=1$ may be further specified, so that a brightness value of the second sub-pixel unit 20 is between two brightness values of the two first sub-pixel units 10 that are left and right adjacent to the second sub-pixel unit 20. The brightness value of the second sub-pixel unit 20 is not greater than the brightness value of the first sub-pixel unit 10 with the larger brightness value of the two first sub-pixel units 10 on the left and right sides of the second sub-pixel unit 20, and not less than the brightness value of the first sub-pixel unit 10 with the smaller brightness value of the two first sub-pixel units 10 on the left and right sides of the second sub-pixel unit 20. In some embodiments, the values of a and b may be designed according to the actual display requirements and circuit design requirements of the second sub-pixel unit 20.

In the present embodiment, the voltage-dividing unit 30 includes two first voltage-dividing resistors 31, one end of one of the two first voltage-dividing resistors 31 is electrically connected to one end of the other of the two first voltage-dividing resistors 31, and the other ends of the two first voltage-dividing resistors 31 serve as a first connection end P1 and a second connection end P2, respectively. A third connection end P3 is led out through a voltage-dividing node N1. The output ends of the sub-pixel driving circuits 11 of the two first sub-pixel units 10 that are respectively left and right adjacent to the second sub-pixel unit 20 are electrically connected to the first connection end P1 and the second connection end P2, respectively. The third connection end P3 is electrically connected to the gate of the second driving transistor M2.

In some embodiments, the values of two display data signals output from the output ends of the sub-pixel driving circuits 11 of the first sub-pixel units 10 that are respectively left and right adjacent to the second sub-pixel unit 20 are defined as V1 and V2 respectively, resistance values of the two first voltage-dividing resistors 31 are defined as R1 and R2 respectively, and a voltage value of the third connection end P3 of the voltage-dividing unit 30 is defined as Vo.

According to Ohm's law, a formula (1) and a formula (2) are obtained.

$$\frac{V1 - V2}{R1 + R2} \cdot R1 = V1 - Vo \tag{1}$$

$$\frac{V2 - V1}{R1 + R2} \cdot R2 = V2 - Vo \tag{2}$$

According to the formula (1) or the formula (2), a formula (3) is obtained.

$$Vo = \frac{R2}{R1 + R2} \cdot V1 + \frac{R1}{R1 + R2} \cdot V2 \tag{3}$$

That is, V1 and V2 output by the sub-pixel driving circuits 11 of the two first sub-pixel units 10 that are respectively left and right adjacent to the second sub-pixel unit 20 are processed by the voltage-dividing unit 30, to generate Vo of the formula (3). Vo of the formula (3) is output to the gate of the second driving transistor M2, so as to drive the second light-emitting element L2 through the second driving transistor M2 to display the corresponding brightness. The voltage-dividing parameter a is R2/(R1+R2), and the voltage-dividing parameter b is R1/(R1+R2).

In some embodiments, R1=R2 is usually set, and a=b=0.5. That is, resistance values of the two first voltage-dividing resistors 31 are equal, and the value Vo of the display data voltage output by the voltage-dividing unit 30 is as follows.

$$Vo = \frac{1}{2}(V1 + V2) \tag{4}$$

The value Vo of the display data voltage output by the voltage-dividing unit 30 is an average value of the display data voltages of two adjacent sub-pixel driving circuits 11. The display brightness of the second sub-pixel unit 20 is the average brightness of the display brightness of the two first sub-pixel units 10 that are respectively left and right adjacent to and coupled to the second sub-pixel unit 20. That is, the second sub-pixel unit 20 may be used as a transition sub-pixel unit between two first sub-pixel units 10 that are respectively left and right adjacent to the second sub-pixel unit 20, so as to transition the brightness of the two first sub-pixel units 10 that are respectively left and right adjacent to the second sub-pixel unit 20, thereby improving the fineness of the displayed image and improving the display effect.

According to the relationship (3), it may be seen that the voltage-dividing parameters a and b of the voltage-dividing unit 30 may be adjusted by adjusting the values R1 and R2 of the two first voltage-dividing resistors 31, so as to adjust the value Vo of the display data voltage output by the voltage-dividing unit 30, thereby adjusting the voltage-dividing effect and obtaining the desired display effect.

Figure 3:
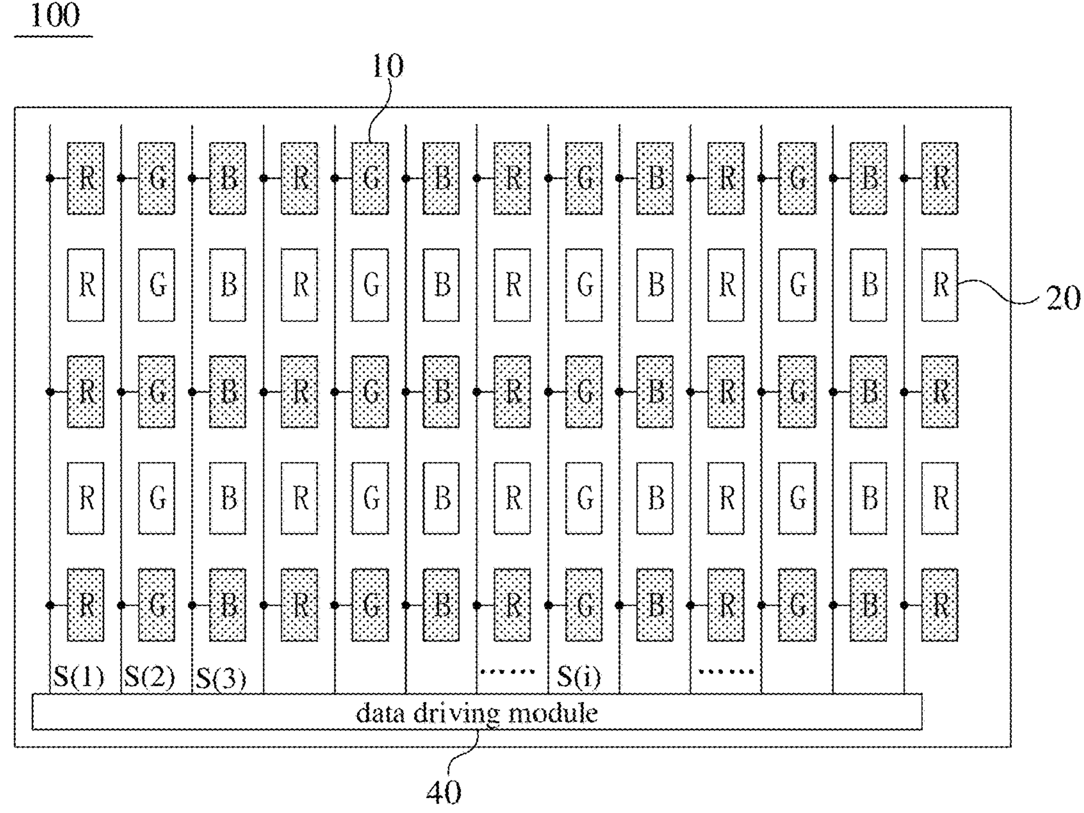
FIG. 3 is a structural schematic view of a display panel in a second embodiment of the present disclosure.

As illustrated in FIG. 3, FIG. 3 is a structural schematic view of a display panel in a second embodiment of the present disclosure. Different from the first embodiment, in the present embodiment. in the pixel matrix formed by the arrangement of the first sub-pixel units 10, one row of second sub-pixel units 20 is disposed between each adjacent two rows of first sub-pixel units 10, so as to form a new pixel matrix. In the new pixel matrix, along the row direction X, each row of first sub-pixel units 10 is alternately arranged in the order of "R-B-G", and each row of second sub-pixel units 20 is alternately arranged in the order of "R-B-G". In each column of the first sub-pixel units 10, one second sub-pixel unit 20 is added and disposed between each two adjacent first sub-pixel units 10. That is, in each column of sub-pixel units, the first sub-pixel unit 10 and the second sub-pixel unit 20 are alternately disposed, so as to improve the pixel density of the display panel 100. The first sub-pixel units 10 and the second sub-pixel units 20 in each column are the same color, so that the sub-pixels with the same color that are respectively on the upper side and the lower side of each second sub-pixel unit 20 and closest to each second sub-pixel unit 20 are all first sub-pixel units 10. In some embodiments, the driving methods of the first sub-pixel units 10 and the second sub-pixel units 20 are the same or similar to the driving methods in the embodiment illustrated in FIG. 2, and may achieve the same technical effect, which are as illustrated in the detailed description above and are not repeated here.

In some embodiments, the gate of the second driving transistor M2 of the second sub-pixel unit 20 may be electrically connected to the output ends of the two sub-pixel driving circuits 11 of the two first sub-pixel units 10 that are respectively on the upper side and the lower side of the second sub-pixel unit 20 and adjacent to the second sub-pixel unit 20 through the voltage-dividing unit 30, so as to drive the second sub-pixel unit 20 through the two sub-pixel driving circuits 11 of the two first sub-pixel units 10 that are respectively on the upper side and the lower side of the second sub-pixel unit 20 and adjacent to the second sub-pixel unit 20. Alternatively, the gate of the second driving transistor M2 of the second sub-pixel unit 20 may also be electrically connected to the output ends of the two sub-pixel driving circuits 11 of the two first sub-pixel units 10 that are closest to the second sub-pixel unit 20 in the previous row or the next row of the row of second sub-pixel units 20 through the voltage-dividing unit 30, so as to drive the second sub-pixel unit 20 through the two sub-pixel driving circuits 11 of the two first sub-pixel units 10 that are closest to the second sub-pixel unit 20 in the previous row or the next row of the row of second sub-pixel units 20.

In the present embodiment, the display panel 100 further includes a plurality of scan lines (not shown in figures). The plurality of scan lines are disposed on one side of each column of first sub-pixel units 10 or one side of each row of first sub-pixel units 10, and extend along the row direction X or column direction Y of the pixel matrix, and intersect with the driving wiring S(i). The first sub-pixel units 10 in the same row or column are connected to the same scan line, so as to scan the pixel matrix row by row or column by column. In some embodiments of the present disclosure, the driving wiring S(i) extending along the column direction Y of the pixel matrix and the scan line extending along the row direction of the pixel matrix, are taken as an example for explanation. The first sub-pixel units 10 in the same row are connected to the same scan line, and the first sub-pixel units 10 in the same column are connected to the same driving wiring S(i). In some embodiments, the control ends of the sub-pixel driving circuits 11 of the first sub-pixel units 10 in the same row are electrically connected to the same corresponding scan line, so that after the scan line transmits the scan signals, the sub-pixel driving circuits 11 in the same row are turned on, thereby transmitting the signals transmitted by the driving wiring S(i) to the first driving light-emitting unit 12.

In some embodiments, the row of second sub-pixel units 20 inserted between two adjacent rows of first sub-pixel units 10 is driven by two adjacent sub-pixel driving circuits 11, thus the second sub-pixel units 20 do not need to be connected to the scan lines, which may not only reduce the number of sub-pixel driving circuits 11, but also effectively reduce the number of scan lines.

Figure 4:
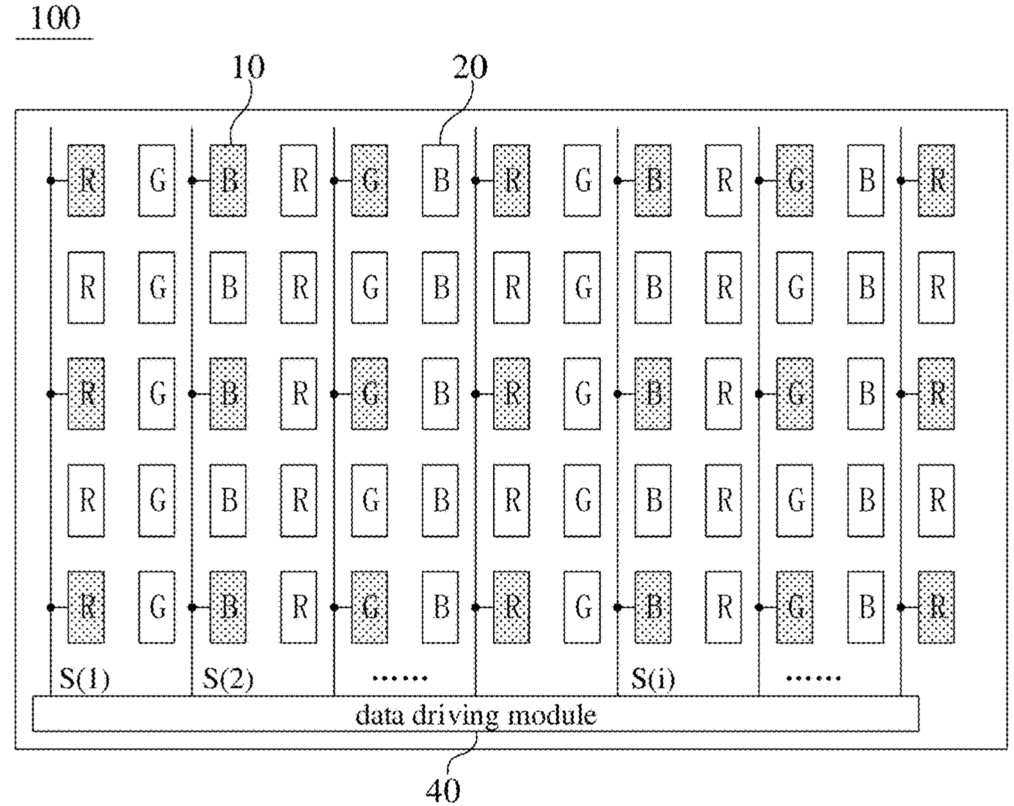
FIG. 4 is a structural schematic view of a display panel in a third embodiment of the present disclosure.

As illustrated in FIG. 4, FIG. 4 is a structural schematic view of a display panel in a third embodiment of the present disclosure. Different from the first embodiment and the second embodiment, in the present embodiment, in the pixel matrix formed by the arrangement of the first sub-pixel units 10, one column of second sub-pixel units 20 is disposed between each two adjacent columns of first sub-pixel units 10, and one row of second sub-pixel units 20 is disposed between each two adjacent rows of first sub-pixel units 10. That is, in the present embodiment, the first embodiment and the second embodiment are combined. In each row of sub-pixel units of the pixel matrix, the first sub-pixel units 10 and the second sub-pixel units 20 are alternately disposed in sequence. In each column of sub-pixel units, the first sub-pixel units 10 and the second sub-pixel units 20 are also alternately disposed in sequence. In the present embodiment, the arrangement patterns of the sub-pixel units with various colors in the pixel matrix are the same as those in the first embodiment and the second embodiment, or they may also be disposed according to other preset patterns according to the needs of the pixel arrangement design, which are not limited. In some embodiments, the second sub-pixel unit 20 may be added and disposed between the first sub-pixel units 10 that are only in a partial display area. The setting position of the second sub-pixel unit 20 may be the same as or similar to the first embodiment, the second embodiment, or the third embodiment, so as to improve the pixel density of the partial display area of the display panel, thereby meeting scene requirements of the display panel for different pixel densities and different display areas.

In the present embodiment, through the above setting, the number of newly added second sub-pixel units 20 is greater, which may further reduce the number of sub-pixel driving circuits 11, thereby further improving the pixel density to meet the product's demand for higher pixel density.

In the present embodiments, the driving methods of the first sub-pixel units 10 and the second sub-pixel units 20 are as follows.

The second sub-pixel units 20 are disposed in the same row as the first sub-pixel units 10, and the second sub-pixel units 20 are disposed in the same column as the first sub-pixel units 10. In the second sub-pixel units 20 disposed in the same column as the first sub-pixel units 10, the sub-pixel units with the same color that are closest to the second sub pixel unit 20 on the upper side and the lower side of the second sub pixel unit 20 are the first sub-pixel units 10, and the sub-pixel units with the same color that are closest to the second sub-pixel unit 20 on the left side and the right side of the second sub-pixel unit 20 are the second sub-pixel units 20. In the second sub-pixel unit 20 disposed in the same row as the first sub-pixel units 10, the sub-pixel units with the same color that are closest to the second sub-pixel unit 20 on the left side and the right side of the second sub pixel unit 20 are the first sub pixel-units 10, and the sub-pixel units closest to the second sub-pixel unit 20 on the upper side and the lower side of the second sub-pixel unit 20 are the second sub-pixel units 20. The driving methods of the first sub-pixel units 10 and the second sub-pixel units 20 that are disposed in the same row and column are the same as or similar to the driving methods of the first sub-pixel units 10 and the second sub-pixel units 20 in the first embodiment and the second embodiments, and may achieve the same technical effects, which are as illustrated in the detailed description above and are not repeated here.

The second sub-pixel units 20 arc disposed in different rows and columns from the first sub-pixel units 10. That is, the sub-pixel units with the same color that are closest to the second sub-pixel unit 20 on the upper side and the lower side of the second sub-pixel unit 20 are the second sub-pixel unit 20. The sub-pixel units with the same color that are closest to the second sub-pixel unit 20 on the left side and the right side of the second sub-pixel unit 20 are the second sub-pixel units 20. The driving methods of the second sub-pixel units 20 that are disposed in different rows and columns from the first sub-pixel units 10 refer to the following detailed description.

Figure 5:
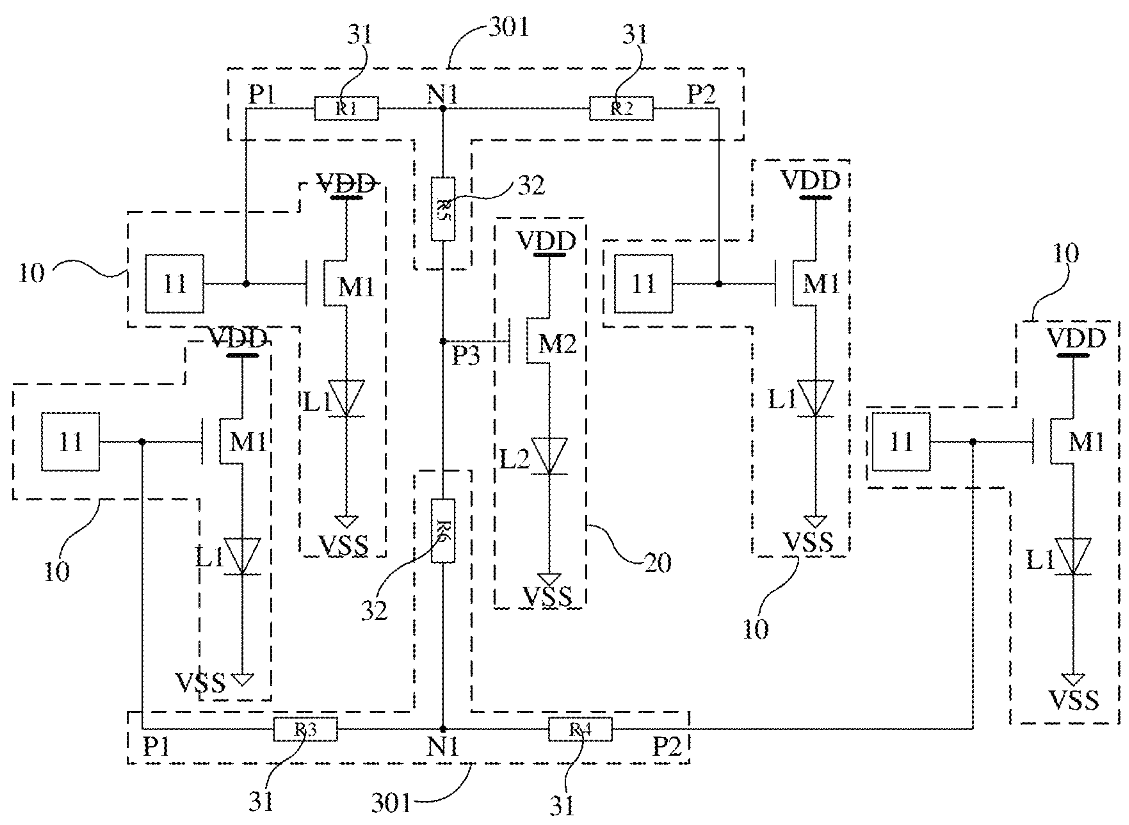
FIG. 5 is a structural schematic view illustrating a circuit principle of a first sub-pixel unit and a second sub-pixel unit in the second embodiment of the present disclosure.

As illustrated in FIG. 5, FIG. 5 is a structural schematic view illustrating a circuit principle of a first sub-pixel unit and a second sub-pixel unit in the second embodiment of the present disclosure. In the present embodiment, the voltage-dividing unit 30 includes two voltage-dividing sub-units 301. Each voltage-dividing sub-unit 301 includes two first voltage-dividing resistors 31, a second voltage-dividing resistor 32, and a voltage-dividing node N1. Ends of the two first voltage-dividing resistors 31 and one second voltage-dividing resistor 32 are respectively electrically connected to the voltage-dividing node N1, and the other ends of the two first voltage-dividing resistors 31 serve as the first connection end P1 and the second connection end P2, respectively. The other ends of the second voltage-dividing resistors 32 of two groups of voltage-dividing sub-units 301 are electrically connected to each other, and a connection node serves as the third connection end P3.

In the second sub-pixel unit 20 which are disposed in the different rows and columns from the first sub-pixel units 10, the sub-pixel driving circuits 11 of four first sub-pixel units 10 adjacent to the second sub-pixel unit 20 are respectively electrically connected to the first connection end P1 and the second connection end P2 of the two voltage-dividing sub-units 301. The third connection end P3 is electrically connected to the gate of a second transistor.

In some embodiments, the four first sub-pixel units 10 adjacent to the second sub-pixel unit 20 may be the two first sub-pixel units 10 in the previous row of sub-pixel units that are closest to the second sub-pixel unit 20, and the two first sub-pixel units 10 in the next row of sub-pixel units that are closest to the second sub-pixel unit 20. As illustrated in FIG. 4, taking a fourth second sub-pixel unit 20 in the second row as an example, the four first sub-pixel units 10 adjacent to the second sub-pixel unit 20 are: a third sub-pixel unit in a first row, a fifth sub-pixel unit in the first row, a third sub-pixel unit in a third row, and a fifth sub-pixel unit in the third row.

In the four first sub-pixel units 10, the output ends of the sub-pixel driving circuits 11 are respectively electrically connected to two first connection ends P1 and two second connection ends P2 of the voltage-dividing unit 30, so as to perform voltage-dividing processing on four display data signals through the voltage-dividing unit 30. The control end of the second driving transistor M2 of the second sub-pixel unit 20 is turned on after receiving the display data signals that are processed by the voltage-dividing processing, and controls the current flowing through itself according to the value of the display data voltage of the gate, so as to control the current flowing through the second light-emitting element L2, so that the second light-emitting element L2 displays the brightness corresponding to the display data voltage.

In some embodiments, the display data signals output by the sub-pixel driving circuits 11 of the four first sub-pixel units 10 are defined as V1, V2, V3 and V4 respectively. Four first voltage-dividing resistors 31 are defined as R1, R2, R3 and R4 respectively. The two second voltage-dividing resistors 32 are defined as R5 and R6 respectively. The voltages of the two voltage-dividing nodes N1 are defined as Vn and Vm respectively. The voltage of the third connection end P3 of the voltage-dividing unit 30 is defined as Vo. Similarly, according to Ohm's law, a formula (5), a formula (6), and a formula (6) are obtained:

$$Vn = \frac{R2}{R1+R2} \cdot V1 + \frac{R1}{R1+R2} \cdot V2 \quad (5)$$

$$Vm = \frac{R4}{R3+R4} \cdot V3 + \frac{R3}{R3+R4} \cdot V4 \quad (6)$$

$$Vo = \frac{R6}{R5+R6} \cdot Vn + \frac{R5}{R5+R6} \cdot Vm \quad (7)$$

The formula (5) and the formula (6) are substituted into and the formula (7), a relationship between Vo and V1, V2, V3, V4, that is a formula (8), may be obtained:

$$Vo = \frac{R2 \cdot R6}{(R1+R2)(R5+R6)} \cdot V1 + \frac{R1 \cdot R6}{(R1+R2)(R5+R6)} \cdot V2 + \frac{R4 \cdot R5}{(R3+R4)(R5+R6)} \cdot V3 + \frac{R3 \cdot R5}{(R3+R4)(R5+R6)} \cdot V4 \quad (8)$$

That is, V1, V2, V3 and V4 output by the sub-pixel driving circuits 11 of the four first sub-pixel units 10 closest to the second sub-pixel unit 20 are processed by the voltage-dividing unit 30 to generate Vo in the formula (8). Vo is output to the gate of the second driving transistor M2, so as to drive the second light-emitting element L2 through the second driving transistor M2 to display the corresponding brightness. The voltage-dividing parameters of the voltage-dividing unit 30 are a, b, c and d, respectively, wherein:

$$a = R2 \cdot R6/[(R1+R2)(R5+R6)];$$

$$b = R1 \cdot R6/[(R1+R2)(R5+R6)];$$

$$c = R4 \cdot R5/[(R3+R4)(R5+R6)];$$

$$d = R3 \cdot R5/[(R3+R4)(R5+R6)].$$

In some embodiments, R1=R2=R3=R4=R5=R6, that is, the resistance values of all the voltage-dividing resistors of the voltage-dividing unit 30 are equal, and a=b=c=d=0.25. The value Vo of the display data voltage output by the voltage-dividing unit 30 meets a formula (9):

$$Vo = \frac{1}{4}(V1 + V2 + V3 + V4) \quad (9)$$

The value Vo of the display data voltage output by the voltage-dividing unit 30 is an average value of the display data voltages of the four adjacent sub-pixel driving circuits 11. The display brightness of the second sub-pixel unit 20 is average brightness of the display brightness of the four first sub-pixel units 10 adjacent and coupled to the second sub-pixel unit 20. That is, the second sub-pixel unit 20 may be used as the transition sub-pixel unit between the four first sub-pixel units 10 adjacent and coupled to the second sub-pixel unit 20. The brightness of the four first sub-pixel units 10 adjacent to the second sub-pixel unit 20 is transitioned, so as to improve the fineness of the displayed image and improve the display effect.

According to the above relationship (8), it may be seen that the voltage-dividing parameters a, b, c and d of the voltage-dividing unit 30 may be adjusted by adjusting the resistance values R1, R2, R3, R4, R5 and R6 of the voltage-dividing resistors of the voltage-dividing unit 30, so as to adjust the value Vo of the display data voltage output by the voltage-dividing unit 30, thereby adjusting the voltage-dividing effect and obtaining the desired display effect.

In some embodiments, a display panel 100 in some embodiments of the present disclosure further includes a data driving module 40. The data driving module 40 includes a plurality of data output ends, and the plurality of data output ends are respectively electrically connected to the plurality of driving wirings S(i). The data driving module 40 is configured to output data driving signals on the data output end, so as to transmit the data driving signals to the first sub-pixel units 10 through the driving wirings S(i), so that the display panel 100 displays the image.

Figure 6:
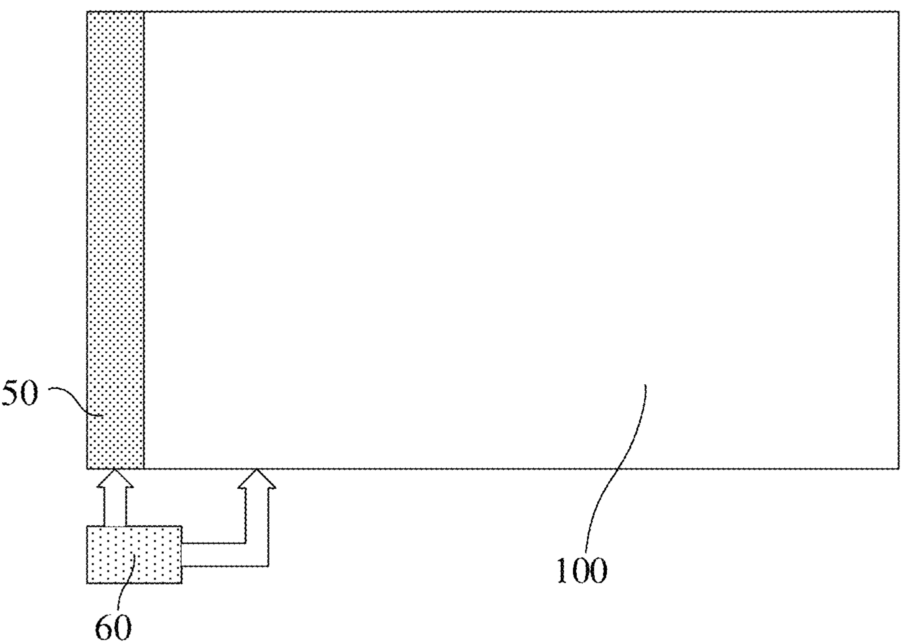
FIG. 6 is a structural schematic view of a display device in an embodiment of the present disclosure.

As illustrated in FIG. 6, FIG. 6 is a structural schematic view of a display device in an embodiment of the present disclosure. In the present embodiment, a display device is provided. The display device may be applied to a display field, such as a mobile phone, a tablet, a notebook, a monitor, a vehicle-mounted display, or the like. The display device includes the display panel 100, a scanning driving module 50, and a power management module 60. The display panel 100 is the display panel 100 of any one of the above embodiments, and a structure and a function of the display panel 100 are the same as or similar to a structure and a function of the display panel 100 of any one of the above embodiments, they may achieve the same technical effect, which are as illustrated in the detailed description above and are not repeated here.

The scanning driving module 50 is coupled to the control end of the sub-pixel driving circuit 11 of the display panel 100, and is configured to transmit scanning driving signals to each sub-pixel driving circuit 11, so as to sequentially scan the sub-pixel driving circuits 11 row by row or column by column, thereby displaying the image. The power management module 60 is configured for providing various required operating power signals to the scanning driving module 50 and the display panel 100, such as the power signal VDD and the common voltage signal VSS required by the display panel 100, power voltage signals VGH and VGL required by the scanning driving module, or the like.

The display device in the present embodiment may effectively reduce the number of the driving wirings S(i) and the number of the sub-pixel driving circuits 11 through the above setting, thereby significantly improving pixel density and saving production costs.

Different from the related art, the effects of the present disclosure are as follows. The present disclosure provides the display panel and the display device. The display panel includes the plurality of driving wirings, the plurality of first sub-pixel units, and the plurality of second sub-pixel units. Each first sub-pixel unit includes the sub-pixel driving circuit and the first driving light-emitting unit. The input end of the sub-pixel driving circuit is electrically connected to the corresponding driving wiring, so as to transmit data driving signals in response to the sub-pixel driving circuit being turned on, and the output end of the sub-pixel driving circuit is electrically connected to the first driving light-emitting unit, thereby driving the first driving light-emitting unit. Furthermore, in the present disclosure, the number of sub-pixel units of the display panel increases by adding the second sub-pixel unit between adjacent first sub-pixel units in at least some of the plurality of first sub-pixel units. Each second sub-pixel unit only include the second driving light-emitting unit. The second driving light-emitting unit is coupled to the output ends of the sub-pixel driving circuits of at least two adjacent first sub-pixel units, so as to drive the corresponding second sub-pixel unit through the sub-pixel driving circuits of at least two adjacent first sub-pixel units. Thus, the number of sub-pixel driving circuits and the number of driving wirings may be effectively reduced, thereby significantly improving the pixel density of the display panel. No additional cost is added, thereby saving production costs.

The above descriptions are only some embodiments of the present disclosure, and are not intended to limit the scope of the present disclosure. Any equivalent structure or equivalent flow transformation made by using the contents of the specification and accompanying drawings of the present disclosure, or directly or indirectly applied to other related technical fields, is included in the scope of the patent protection of the present disclosure.

What is claimed is:

1. A display panel, comprising:

a plurality of driving wirings, configured to transmit data driving signals;

a plurality of first sub-pixel units, wherein each of the plurality of first sub-pixel units comprises a sub-pixel driving circuit and a first driving light-emitting unit, an input end of the sub-pixel driving circuit is electrically connected to a corresponding one of the plurality of driving wirings, and an output end of the sub-pixel driving circuit is electrically connected to a corresponding first driving light-emitting unit; and a plurality of second sub-pixel units, wherein in at least some of the plurality of first sub-pixel units, each of the plurality of second sub-pixel unit is disposed between adjacent first sub-pixel units;

wherein each of the plurality of second sub-pixel units only comprises a second driving light-emitting unit, and the second driving light-emitting unit is coupled to output ends of the sub-pixel driving circuits of at least two adjacent first sub-pixel units, so as to drive a corresponding one of the plurality of second sub-pixel units through the sub-pixel driving circuits of the at least two adjacent first sub-pixel units;

for each first sub-pixel unit, the first driving light-emitting unit comprises a first driving transistor and a first light-emitting element, a gate of the first driving transistor is electrically connected to the output end of the sub-pixel driving circuit of the first sub-pixel unit, a first end of the first driving transistor is connected to a power signal, and a second end of the first driving transistor is electrically connected to the first light emitting element of the first sub-pixel unit; and for each second sub-pixel unit, the second driving light-emitting unit comprises a second driving transistor and a second light-emitting element, a gate of the second driving transistor is coupled to the output ends of the sub-pixel driving circuits of at least two adjacent first sub-pixel units, a first end of the second driving transistor is connected to the power signal, and a second end of the second driving transistor is electrically connected to the second light-emitting element of the second sub-pixel unit.

2. The display panel according to claim 1, further comprising a voltage-dividing unit for each second sub-pixel unit, wherein the second driving light emitting unit is electrically connected to the output ends of the sub-pixel driving circuits of at least two adjacent first sub-pixel units through the voltage-dividing unit; and the gate of the second driving transistor is electrically connected to the output ends of the sub-pixel driving circuits of at least two adjacent first sub-pixel units through the voltage-dividing unit.

3. The display panel according to claim 2, wherein the plurality of first sub-pixel units comprises at least three sub-pixel units with different colors, and the at least three sub-pixel units with different colors are arranged in a pixel matrix according to a preset pattern; and each of the plurality of driving wirings is disposed on a side of each column of the plurality of first sub-pixel units or a side of each row of the plurality of first sub-pixel units, each of the plurality of driving wirings extends along a column direction of the pixel matrix or a row direction of the pixel matrix, and the plurality of first sub-pixel units in the same row or in the same column are connected to the same driving wiring.

4. The display panel according to claim 3, wherein a row and/or a column of the plurality of second sub-pixel units are disposed between every two adjacent rows and/or every two adjacent columns of the plurality of first sub-pixel units.

5. The display panel according to claim 4, wherein the voltage-dividing unit comprises two first voltage-dividing resistors and a voltage-dividing node, ends of the two first voltage-dividing resistors are electrically connected to the voltage-dividing node respectively, the other ends of the two first voltage-dividing resistors serve as a first connection end and a second connection end respectively, and a connection node between the two first voltage-dividing resistors serves as a third connection end; and in the plurality of second sub-pixel units disposed in the same row and/or column as the plurality of first sub-pixel units, the output ends of the sub-pixel driving circuits of two first sub-pixel units adjacent to the corresponding one of the plurality of second sub-pixel units are electrically connected to the first connection end and the second connection end respectively, and the third connection end is electrically connected to a gate of a second transistor.

6. The display panel according to claim 5, wherein a resistance value of each first voltage-dividing resistor is the same as a resistance value of each second voltage-dividing resistor.

7. The display panel according to claim 4, wherein each voltage-dividing unit comprises two voltage-dividing sub-units, each voltage-dividing sub-unit comprises two first voltage-dividing resistors, a second voltage-dividing resistor, and a voltage-dividing node; ends of the two first voltage-dividing resistors and one second voltage-dividing resistor are respectively electrically connected to the voltage-dividing node, and the other ends of the two first voltage-dividing resistors serve as the first connection end and the second connection end, respectively; the other ends of the second voltage-dividing resistors of two groups of voltage-dividing sub-units are electrically connected to each other, and a connection node serves as the third connection end; and in the plurality of second sub-pixel units disposed in different rows and columns from the plurality of first sub-pixel units, the sub-pixel driving circuits of four first sub-pixel units adjacent to the corresponding one of the plurality of second sub-pixel units are respectively electrically connected to the first connection end and the second connection end of the two voltage-dividing sub-units, and the third connection end is electrically connected to a gate of a second transistor.

8. The display panel according to claim 4, wherein in each row and/or each column of sub-pixel units, a color of one of the plurality of second sub-pixel units is different from colors of two first sub-pixel units adjacent to the one of the plurality of second sub-pixel units, so that the one of the plurality of second sub-pixel units and the two first sub-pixel units adjacent to the one of the plurality of second sub-pixel units form a pixel unit.

9. The display panel according to claim 1, wherein the sub-pixel driving circuit in each first sub-pixel unit is configured to generate a display data voltage through cooperation of a plurality of thin film transistors, and the display data voltage is configured for driving and compensation, thereby driving the first driving light-emitting unit in the first sub-pixel unit to display corresponding brightness.

10. A display device, comprising:

a display panel, comprising:

a plurality of driving wirings, configured to transmit data driving signals;

a plurality of first sub-pixel units, wherein each of the plurality of first sub-pixel units comprises a sub-pixel driving circuit and a first driving light-emitting unit, an input end of the sub-pixel driving circuit is electrically connected to a corresponding one of the plurality of driving wirings, and an output end of the sub-pixel driving circuit is electrically connected to a corresponding first driving light-emitting unit; and a plurality of second sub-pixel units, wherein in at least some of the plurality of first sub-pixel units, each of the plurality of second sub-pixel unit is disposed between adjacent first sub-pixel units;

wherein each of the plurality of second sub-pixel units only comprises a second driving light-emitting unit, and the second driving light-emitting unit is coupled to output ends of the sub-pixel driving circuits of at least two adjacent first sub-pixel units, so as to drive a corresponding one of the plurality of second sub-pixel units through the sub-pixel driving circuits of the at least two adjacent first sub-pixel units;

for each first sub-pixel unit, the first driving light-emitting unit comprises a first driving transistor and a first light-emitting element, a gate of the first driving transistor is electrically connected to the output end of the sub-pixel driving circuit of the first sub-pixel unit, a first end of the first driving transistor is connected to a power signal, and a second end of the first driving transistor is electrically connected to the first light emitting element of the first sub-pixel unit; and for each second sub-pixel unit, the second driving light-emitting unit comprises a second driving transistor and a second light-emitting element, a gate of the second driving transistor is coupled to the output ends of the sub-pixel driving circuits of at least two adjacent first sub-pixel units, a first end of the second driving transistor is connected to the power signal, and a second end of the second driving transistor is electrically connected to the second light-emitting element of the second sub-pixel unit.

11. The display device according to claim 10, wherein the display panel further comprises a voltage-dividing unit for each second sub-pixel unit, wherein the second driving light emitting unit is electrically connected to the output ends of the sub-pixel driving circuits of at least two adjacent first sub-pixel units through the voltage-dividing unit; and the gate of the second driving transistor is electrically connected to the output ends of the sub-pixel driving circuits of at least two adjacent first sub-pixel units through the voltage-dividing unit.

12. The display device according to claim 11, wherein the plurality of first sub-pixel units comprises at least three sub-pixel units with different colors, and the at least three sub-pixel units with different colors are arranged in a pixel matrix according to a preset pattern; and each of the plurality of driving wirings is disposed on a side of each column of the plurality of first sub-pixel units or a side of each row of the plurality of first sub-pixel units, each of the plurality of driving wirings extends along a column direction of the pixel matrix or a row direction of the pixel matrix, and the plurality of first sub-pixel units in the same row or in the same column are connected to the same driving wiring.

13. The display device according to claim 12, wherein a row and/or a column of the plurality of second sub-pixel units are disposed between every two adjacent rows and/or every two adjacent columns of the plurality of first sub-pixel units.

14. The display device according to claim 13, wherein the voltage-dividing unit comprises two first voltage-dividing resistors and a voltage-dividing node, ends of the two first voltage-dividing resistors are electrically connected to the voltage-dividing node respectively, the other ends of the two first voltage-dividing resistors serve as a first connection end and a second connection end respectively, and a connection node between the two first voltage-dividing resistors serves as a third connection end; and in the plurality of second sub-pixel units disposed in the same row and/or column as the plurality of first sub-pixel units, the output ends of the sub-pixel driving circuits of two first sub-pixel units adjacent to the corresponding one of the plurality of second sub-pixel units are electrically connected to the first connection end and the second connection end respectively, and the third connection end is electrically connected to a gate of a second transistor.

15. The display device according to claim 14, wherein a resistance value of each first voltage-dividing resistor is the same as a resistance value of each second voltage-dividing resistor.

16. The display device according to claim 13, wherein each voltage-dividing unit comprises two voltage-dividing sub-units, each voltage-dividing sub-unit comprises two first voltage-dividing resistors, a second voltage-dividing resistor, and a voltage-dividing node; ends of the two first voltage-dividing resistors and one second voltage-dividing resistor are respectively electrically connected to the voltage-dividing node, and the other ends of the two first voltage-dividing resistors serve as the first connection end and the second connection end, respectively; the other ends of the second voltage-dividing resistors of two groups of voltage-dividing sub-units are electrically connected to each other, and a connection node serves as the third connection end; and in the plurality of second sub-pixel units disposed in different rows and columns from the plurality of first sub-pixel units, the sub-pixel driving circuits of four first sub-pixel units adjacent to the corresponding one of the plurality of second sub-pixel units are respectively electrically connected to the first connection end and the second connection end of the two voltage-dividing sub-units, and the third connection end is electrically connected to a gate of a second transistor.

17. The display device according to claim 13, wherein in each row and/or each column of sub-pixel units, a color of one of the plurality of second sub-pixel units is different from colors of two first sub-pixel units adjacent to the one of the plurality of second sub-pixel units, so that the one of the plurality of second sub-pixel units and the two first sub-pixel units adjacent to the one of the plurality of second sub-pixel units form a pixel unit.

18. The display device according to claim 10, wherein the sub-pixel driving circuit in each first sub-pixel unit is configured to generate a display data voltage through cooperation of a plurality of thin film transistors, and the display data voltage is configured for driving and compensation, thereby driving the first driving light-emitting unit in the first sub-pixel unit to display corresponding brightness.

* * * * *